(12) United States Patent
Wakabayashi (10) Patent No.: US 12,406,792 B2
(45) Date of Patent: Sep. 2, 2025

(54) ELECTRONIC COMPONENT AND METHOD OF MANUFACTURING THE SAME

(71) Applicant: TAIYO YUDEN CO., LTD., Tokyo (JP)

(72) Inventor: Hirotaka Wakabayashi, Tokyo (JP)

(73) Assignee: TAIYO YUDEN CO., LTD., Tokyo (JP)

(*) Notice: Subject to any disclaimer, the term of this patent is extended or adjusted under 35 U.S.C. 154(b) by 885 days.

(21) Appl. No.: 17/131,434

(22) Filed: Dec. 22, 2020

(65) Prior Publication Data
US 2021/0202154 A1    Jul. 1, 2021

(30) Foreign Application Priority Data
Dec. 27, 2019 (JP) ................................. 2019-238965

(51) Int. Cl.
  *H01F 27/28*  (2006.01)
  *H01F 1/33*  (2006.01)
  (Continued)

(52) U.S. Cl.
  CPC ........... *H01F 27/2804* (2013.01); *H01F 1/33* (2013.01); *H01F 27/32* (2013.01); *H05K 1/162* (2013.01);
  (Continued)

(58) Field of Classification Search
  CPC .............................. H01F 27/2804; H01F 27/32
  (Continued)

(56) References Cited

U.S. PATENT DOCUMENTS 4,604,676 A * 8/1986 Senda .................. H01G 4/2325
  361/309
4,982,485 A    1/1991 Nakaya et al.
  (Continued)

FOREIGN PATENT DOCUMENTS

JP    62-026166 B2    6/1987
JP    H02-78211 A    3/1990
  (Continued)

OTHER PUBLICATIONS

Science Direct, Thin Solid Films, vol. 596, Dec. 1, 2015, pp. 29-33 (Year: 2015).*
  (Continued)

*Primary Examiner* — Shawki S Ismail
*Assistant Examiner* — Joselito S. Baisa
(74) *Attorney, Agent, or Firm* — Pillsbury Winthrop Shaw Pittman, LLP (57) ABSTRACT

One object of the present invention is to provide an electronic component less prone to migration of impurity atoms between a conductor and an external electrode. A coil component as an electronic component includes a base body, a conductor, a first external electrode electrically connected to one end portion of the conductor, a second external electrode electrically connected to the other end portion of the conductor, a first film positioned between one end portion of the conductor and the first external electrode, and a second film positioned between the other end portion of the conductor and the second external electrode. The diffusion velocity in the first film and the second film is lower than that in the first external electrode and the second external electrode.

8 Claims, 6 Drawing Sheets

(51) Int. Cl.
  *H01F 27/32* (2006.01)
  *H05K 1/16* (2006.01)
(52) U.S. Cl.
  CPC ..... *H05K 1/165* (2013.01); *H01F 2027/2809* (2013.01)
(58) Field of Classification Search
  USPC .................................................. 336/199, 200
  See application file for complete search history.

(56) References Cited

U.S. PATENT DOCUMENTS

| | | | | |
|---|---|---|---|---|
| 5,659,201 | A * | 8/1997 | Wollesen | H01L 23/53233 257/784 |
| 6,729,003 | B2 * | 5/2004 | Yokoyama | H01C 1/148 419/48 |
| 10,847,317 | B2 * | 11/2020 | Hayashi | H05K 1/162 |
| 10,903,011 | B2 * | 1/2021 | Han | C23C 16/045 |
| 11,915,879 | B2 * | 2/2024 | Okada | H01G 4/248 |
| 2011/0300307 | A1 * | 12/2011 | Nakai | H05K 3/0035 427/554 |
| 2014/0041913 | A1 * | 2/2014 | Yanagida | H01G 4/30 174/260 |
| 2014/0111300 | A1 * | 4/2014 | Park | H01G 4/30 336/200 |
| 2016/0225512 | A1 * | 8/2016 | Kim | H01F 3/10 |
| 2019/0051467 | A1 * | 2/2019 | Kimura | H01G 4/0085 |
| 2019/0103225 | A1 * | 4/2019 | Han | H01G 4/2325 |
| 2019/0244742 | A1 | 8/2019 | Song et al. | |
| 2019/0252123 | A1 * | 8/2019 | Kim | H01G 4/12 |
| 2019/0333688 | A1 * | 10/2019 | Song | H01F 27/292 |
| 2020/0118752 | A1 * | 4/2020 | Cho | H01G 4/224 |
| 2021/0358690 | A1 * | 11/2021 | Iguchi | H01G 2/065 |

FOREIGN PATENT DOCUMENTS

| | | | |
|---|---|---|---|
| JP | 2002110451 | A * | 4/2002 |
| JP | 2002151516 | A * | 5/2002 |
| JP | 2019-140371 | A | 8/2019 |
| KR | 20110130342 | A * | 12/2011 |

OTHER PUBLICATIONS

Notice Reasons for Refusal dated Nov. 7, 2023, issued in corresponding Japanese Patent Application No. 2019-238965 with English translation (8 pgs.).

Notice of Reasons for Refusal dated May 7, 2024, issued in corresponding Japanese Patent Application No. 2019-238965, with English translation (7 pgs.).

Decision for Refusal dated Oct. 8, 2024, issued in corresponding Japanese Patent Application No. 2019-238965, with English translation (7 pgs.).

* cited by examiner

ELECTRONIC COMPONENT AND METHOD OF MANUFACTURING THE SAME

CROSS-REFERENCE TO RELATED APPLICATIONS

This application is based on and claims the benefit of priority from Japanese Patent Application Serial No. 2019-238965 (filed on Dec. 27, 2019), the contents of which are hereby incorporated by reference in their entirety.

TECHNICAL FIELD

The present disclosure relates to an electronic component and a method of manufacturing the electronic component.

BACKGROUND

An example of a known electronic component is a coil component such as an inductor. A conventional coil component typically includes a magnetic base body made of a magnetic material, a conductor provided in the magnetic base body and wound around a coil axis, and an external electrode connected to an end portion of the conductor. Such a coil component is mounted on a substrate, for example, through electric connection between the external electrode and the substrate soldered to each other, for use as a component of various electronic devices. An example of the conventional coil component is disclosed in Japanese Patent Application Publication No. 2019-140371.

Between the conductor and the external electrode of the electronic component, migration of impurity atoms contained in the solder or the like may occur due to heat or voltage application. Once the migration occurs, the impurity atoms are alloyed with the material forming the conductor or the external electrode, thereby forming voids in the conductor and/or the external electrode. As a result, the joint strength between the conductor and the external electrode is unfavorably reduced.

SUMMARY

One object of the present invention is to provide an electronic component and a method of manufacturing the electronic component less prone to migration of impurity atoms between the conductor and the external electrode. Other objects of the present invention will be made apparent through the entire description in the specification.

An electronic component according to one embodiment of the present invention comprises: a base body; a conductor provided inside or outside the base body; a first external electrode and a second external electrode both electrically connected to the conductor; and a first film positioned between the first external electrode and one end portion of the conductor electrically connected to the first external electrode, and a second film positioned between the second external electrode and the other end portion of the conductor electrically connected to the second external electrode, wherein a diffusion velocity in the first film and the second film is lower than that in the first external electrode and the second external electrode.

In one embodiment of the present invention, a thickness of the first film and a thickness of the second film may be 10 nm to 200 nm.

In one embodiment of the present invention, the first film and the second film may be oxide films.

In one embodiment of the present invention, the first film and the second film may be an oxide of a metal material having the same or a lower ionization tendency than a material forming the conductor.

In one embodiment of the present invention, the first film and the second film may be nitride films, carbonized films, or oxynitride films.

In one embodiment of the present invention, the first film and the second film may be amorphous.

In one embodiment of the present invention, indentations in an interface between the first film and the first external electrode and an interface between the second film and the second external electrode may be larger than indentations in surfaces of the first external electrode and the second external electrode.

In one embodiment of the present invention, the conductor may include a portion wound around a coil axis.

An embodiment of the present invention relates to a circuit board comprising any one of the above coil components. One embodiment of the present invention relates to an electronic device comprising the above circuit board.

A method of manufacturing an electronic component according to one embodiment of the present invention is a method of manufacturing an electronic component including a base body, a conductor provided inside or outside the base body, and a first external electrode and a second external electrode both electrically connected to the conductor, the method comprising: a first step of positioning a first end portion and a second end portion of the conductor at a surface of the base body, the first end portion being configured to be electrically connected with the first external electrode, the second end portion being configured to be electrically connected with the second external electrode; a second step of forming a first film and a second film, the first film being electrically connected with the first end portion, the second film being electrically connected with the second end portion; and a third step of forming a first external electrode and a second external electrode, the first external electrode being electrically connected with the first film, the second external electrode being electrically connected with the second film, wherein in the second step, the first film and the second film are formed of a material having a lower diffusion velocity than a material forming the first external electrode and the second external electrode.

Advantageous Effects

The present invention provides an electronic component and a method of manufacturing the electronic component less prone to migration of impurity atoms between the conductor and the external electrode.

DESCRIPTION OF THE EMBODIMENTS

Various embodiments of the present invention will be hereinafter described with reference to the accompanying drawings. The constituents common to more than one drawing are denoted by the same reference signs throughout the drawings. For convenience of explanation, the drawings are not necessarily drawn to scale.

Figure 1:
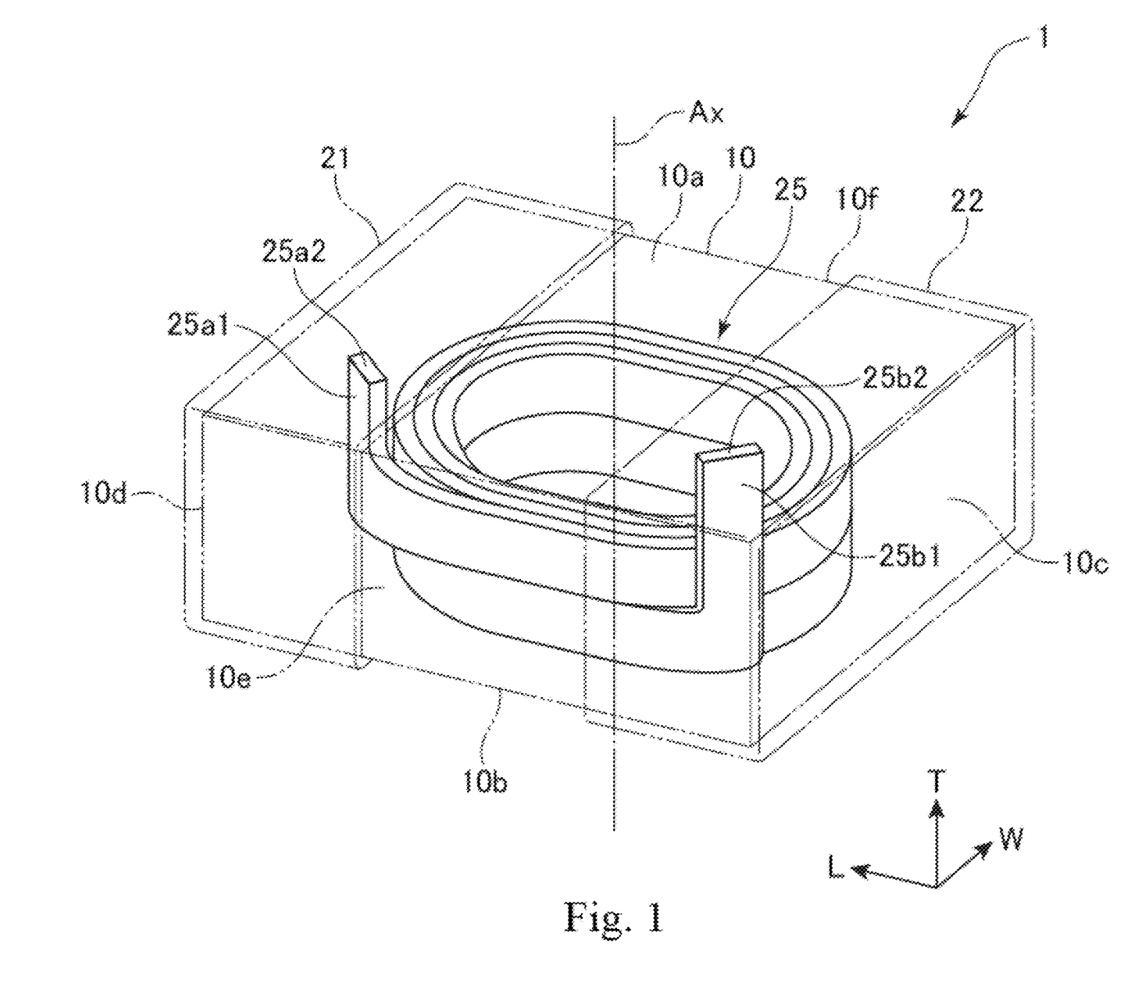
FIG. 1 is a perspective view schematically showing a coil component as an electronic component according to one embodiment of the present invention.

A coil component 1 as an electronic component according to one embodiment of the present invention will be hereinafter outlined with reference to FIG. 1. FIG. 1 is a perspective view schematically showing the coil component 1. As shown in FIG. 1, the coil component 1 includes a base body 10, a coil conductor 25 provided in the base body 10, an external electrode (first external electrode) 21 disposed on a surface of the base body 10, and an external electrode (second external electrode) 22 disposed on the surface of the base body 10 at a position spaced apart from the external electrode 21.

In this specification, a "length" direction, a "width" direction, and a "thickness" direction of the coil component 1 correspond to the "L axis" direction, the "W axis" direction, and the "T axis" direction in FIG. 1, respectively, unless otherwise construed from the context. The "thickness" direction is also referred to as the "height" direction.

The coil component 1 is mounted on a circuit board (not shown). The circuit board has two land portions provided thereon. The coil component 1 is mounted on the circuit board by bonding the external electrodes 21, 22 to the land portions corresponding to the external electrodes 21, 22, respectively. The circuit board can be installed in electronic devices such as smartphones, tablets, game consoles, and various others. The circuit board may also be installed in an electric component of an automobile, which is a sort of electronic device.

The coil component 1 may be applied to inductors, transformers, filters, reactors, and various other coil components. The coil component 1 may also be applied to coupled inductors, choke coils, and various other magnetically coupled coil components. Applications of the coil component 1 are not limited to those explicitly described herein.

The base body 10 is made of an insulating material. In one embodiment, the magnetic base body 10 is made mainly of a magnetic material and formed in a rectangular parallelepiped shape. In the coil component 1 according to one embodiment of the invention, the base body 10 has a length (the dimension in the L axis direction) of 1.0 mm to 4.5 mm, a width (the dimension in the W axis direction) of 0.5 mm to 3.2 mm, and a height (the dimension in the T axis direction) of 0.5 mm to 5.0 mm. The dimensions of the base body 10 are not limited to those specified herein. The term "rectangular parallelepiped" or "rectangular parallelepiped shape" used herein is not intended to mean solely "rectangular parallelepiped" in a mathematically strict sense.

The base body 10 has a first principal surface 10a, a second principal surface 10b, a first end surface 10c, a second end surface 10d, a first side surface 10e, and a second side surface 10f. These six surfaces define the outer periphery of the base body 10. The first principal surface 10a and the second principal surface 10b are at the opposite ends in the height direction, the first end surface 10c and the second end surface 10d are at the opposite ends in the length direction, and the first side surface 10e and the second side surface 10f are at the opposite ends in the width direction.

As shown in FIG. 1, the first principal surface 10a lies on the top side of the magnetic base body 10, and therefore, the first principal surface 10a may be herein referred to as "the top surface." Similarly, the second principal surface 10b may be referred to as "the bottom surface." The coil component 1 is disposed such that the first principal surface 10a faces the circuit board, and therefore, the first principal surface 10a may be herein referred to as "the mounting surface." The top-bottom direction of the coil component 1 refers to the top-bottom direction in FIG. 1.

Figure 2:
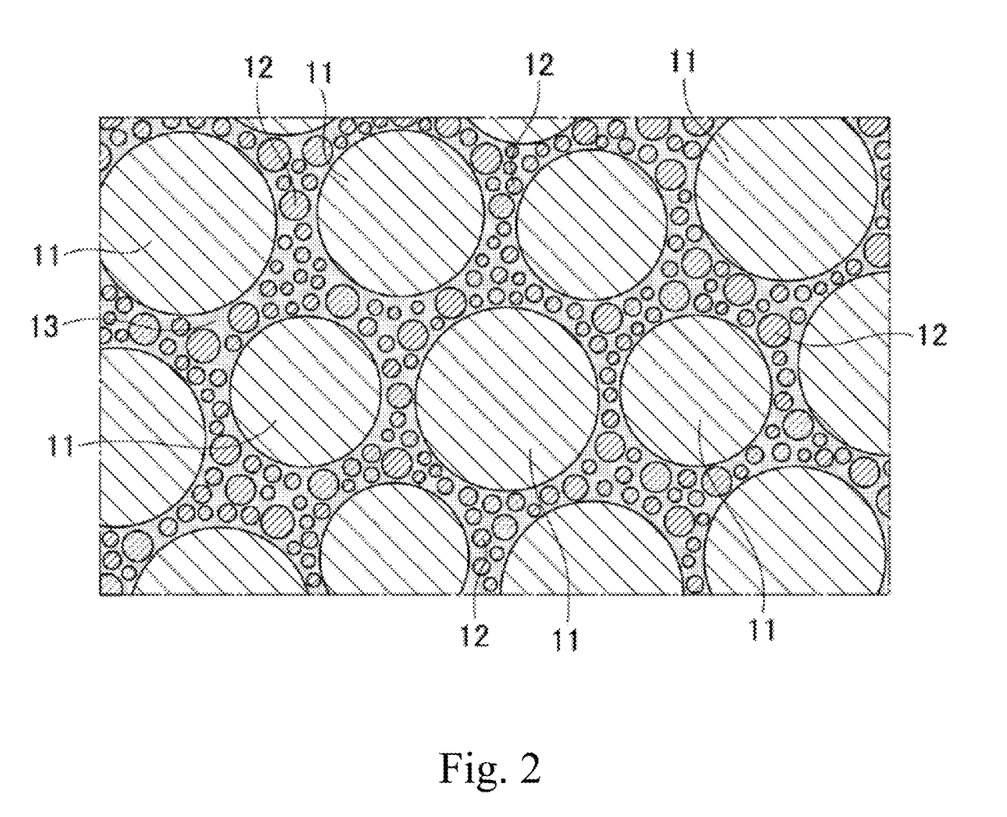
FIG. 2 is an enlarged sectional view schematically showing, on an enlarged scale, a sectional surface of a magnetic base body of the coil component shown in FIG. 1.

Next, the base body 10 which is magnetic will be further described with reference to FIG. 2. FIG. 2 is an enlarged sectional view schematically showing, on an enlarged scale, a sectional surface of the base body 10. As shown in the drawing, the base body 10 contains a plurality of first metal magnetic particles 11, a plurality of second metal magnetic particles 12, and a binder 13. The binder 13 binds together the plurality of first metal magnetic particles 11 and the plurality of second metal magnetic particles 12. In other words, the base body 10 is formed of the binder 13 and the plurality of first metal magnetic particles 11 and the plurality of second metal magnetic particles 12 bound to each other by the binder 13.

The plurality of first metal magnetic particle 11 have a larger average particle size than the plurality of second metal magnetic particles 12. That is, the average particle size of the plurality of first metal magnetic particles 11 (hereinafter referred to as the first average particle size) is different from the average particle size of the plurality of second metal magnetic particles 12 (hereinafter referred to as the second average particle size). For example, the first average particle size is 30 μm, and the second average particle size is 0.1 μm, but these are not limitative. In one embodiment of the present invention, the magnetic base body 10 may further contain a plurality of third metal magnetic particles (not shown) having an average particle size different from the first average particle size and the second average particle size (the average particle size of the third metal magnetic particles is hereinafter referred to as the third average particle size). The third average particle size may be smaller than the first average particle size and larger than the second average particle size, or it may be smaller than the second average particle size. The first metal magnetic particles 11, the second metal magnetic particles 12, and the third metal magnetic particles contained in the magnetic base body 10 may be hereinafter collectively referred to as "the metal magnetic particles" when they need not be distinguished from one another.

The first metal magnetic particles 11 and the second metal magnetic particles 12 can be formed of various soft magnetic materials. For example, a main ingredient of the first metal magnetic particles 11 is Fe. Specifically, the first metal magnetic particles 11 are particles of (1) a metal such as Fe or Ni, (2) a crystalline alloy such as an Fe—Si—Cr alloy, an Fe—Si—Al alloy, or an Fe—Ni alloy, (3) an amorphous alloy such as an Fe—Si—Cr—B—C alloy or an Fe—Si—Cr—B alloy, or (4) a mixture thereof. The composition of the metal magnetic particles contained in the magnetic base body 10 is not limited to those described above. The first metal magnetic particles 11 may contain, for example, 85 wt % or more Fe. This provides the magnetic base body 10 with an excellent magnetic permeability. The composition of the second metal magnetic particles 12 is either the same as or different from that of the first metal magnetic particles 11. When the magnetic base body 10 contains the plurality of third metal magnetic particles (not shown), the composition of the third metal magnetic particles is either the same as or different from that of the first metal magnetic particles 11, as with the second metal magnetic particles 12.

The surfaces of the metal magnetic particles may be coated with insulating films (not shown). The insulting films are formed of, for example, a glass, a resin, or other materials having a high insulating property. For example, the insulting films are formed on the surfaces of the first metal magnetic particles 11 by mixing the first metal magnetic particles 11 with powder of a glass material in a friction mixer (not shown). The insulating films formed of the glass material are adhered to the surfaces of the first metal magnetic particles 11 by the compression friction action in the friction mixer. The glass material may contain ZnO and $P_2O_5$. The insulating films may be formed of various glass materials. The insulating films 14 may be formed of alumina powder, zirconia powder, or any other oxide powders having a high insulating property, in place of or in addition to the glass powder. The thickness of the insulating films is, for example, 100 nm or smaller.

The second metal magnetic particles 12 may be coated with different insulating films than the first metal magnetic particles 11. The insulating films may be oxide films formed by oxidation of the second metal magnetic particles 12. The thickness of the insulating films is, for example, 20 nm or smaller. The insulating films may be oxide films formed on the surfaces of the second metal magnetic particles 12 by heat-treating the second metal magnetic particles 12 in the atmosphere. The insulating films may be oxide films containing oxides of Fe and other elements contained in the second metal magnetic particles 12. These insulating films may be iron phosphate films formed on the surfaces of the second metal magnetic particles 12 by placing the second metal magnetic particles 12 into phosphoric acid and stirring. The insulating films of the first metal magnetic particles 11 may be oxide films formed by oxidation of the first metal magnetic particles 11, whereas the insulating films of the second metal magnetic particles 12 may be coating films formed by a method other than oxidation of the second metal magnetic particles 12.

The binder 13 is, for example, a thermosetting resin having a high insulating property. Examples of the binder 13 include an epoxy resin, a polyimide resin, a polystyrene (PS) resin, a high-density polyethylene (HDPE) resin, a polyoxymethylene (POM) resin, a polycarbonate (PC) resin, a polyvinylidene fluoride (PVDF) resin, a phenolic resin, a polytetrafluoroethylene (PTFE) resin, or a polybenzoxazole (PB 0) resin. The binder 13 may also be glass or other materials and may contain an insulating filler.

The conductor 25 is formed in a pattern. In the embodiment shown, the conductor 25 is wound around the coil axis Ax (see FIG. 1). When seen from above, the conductor 25 has, for example, a spiral shape, a meander shape, a linear shape or a combined shape of these.

The conductor 25 is formed by plating with Cu, Ag, or other conductive materials. The entire surface of the conductor 25 other than an end surface 25a2 and an end surface 25b2 may be coated with an insulating film. As shown, when the conductor 25 is wound around the coil axis Ax for a plurality of turns, each of the turns of the conductor 25 may be separated from adjacent turns. In this arrangement, the base body 10 mediates between the adjacent turns.

The conductor 25 includes a lead-out conductor 25a1 at one end portion thereof (the end portion electrically connected with the external electrode 21) and a lead-out conductor 25b1 at the other end portion thereof (the end portion electrically connected with the external electrode 22). The lead-out conductor 25a1 has the end surface 25a2 at an end portion thereof, and the lead-out conductor 25b1 has the end surface 25b2 at an end portion thereof. The conductor 25 is electrically connected to the external electrode 21 via the lead-out conductor 25a1 forming one end portion thereof, and the conductor 25 is also electrically connected to the external electrode 22 via the lead-out conductor 25b1 forming the other end portion thereof.

In one embodiment of the present invention, the external electrode 21 extends on a part of the first principal surface 10a, the second principal surface 10b, the second end surface 10c, the first side surface 10e, and the second side surface 10f of the base body 10. The external electrode 22 extends on a part of the first principal surface 10a, the second principal surface 10b, the second end surface 10d, the first side surface 10e, and the second side surface 10f of the base body 10. The external electrodes 21, 22 are spaced apart from each other. Shapes and arrangements of the external electrodes 21, 22 are not limited to those in the example shown. Both the lead-out conductor 25a1 and the lead-out conductor 25b1 lead to the first principal surface (the mounting surface) 10a of the base body 10, and the end surface 25a2 of the lead-out conductor 25a1 and the end surface 25b2 of the lead-out conductor 25b1 are exposed from the base body 10 through the first principal surface 10a. That is, the end surface 25a2 of the lead-out conductor 25a1 and the end surface 25b2 of the lead-out conductor 25b1 are exposed from the base body 10 through the same surface. It is also possible that the end surface 25a2 of the lead-out conductor 25a1 and the end surface 25b2 of the lead-out conductor 25b1 are exposed from the base body 10 through different surfaces.

Each of the external electrodes 21, 22 is either entirely made of a metal or partially made of a non-metal material such as a resin. An example of an external electrode partially made of a non-metal material such as a resin is a conductive resin film. In the embodiment shown, the external electrodes 21, 22 are conductive resin films containing metal fillers F and a conductive resin R (see FIG. 4). The metal fillers F may include first metal fillers F1 having a relatively smaller particle size and second metal fillers F2 having a relatively larger particle size. The average particle size of the first metal fillers F1 is about 0.1 μm to 2.0 μm, and the average particle size of the second metal fillers F2 is about 2.0 μm to 15 μm. The first metal fillers F1 and the second metal fillers F2 are formed of Ag, for example. The metal fillers F may also be single size fillers. The conductive resin film may have, for example, a plating layer provided on the surface thereof. The plating layer may be composed of, for example, a single plating layer such as a Ni plating layer and a Sn plating layer, or two plating layers including a Ni plating layer and a Sn plating layer formed on the Ni plating layer.

Figure 3:
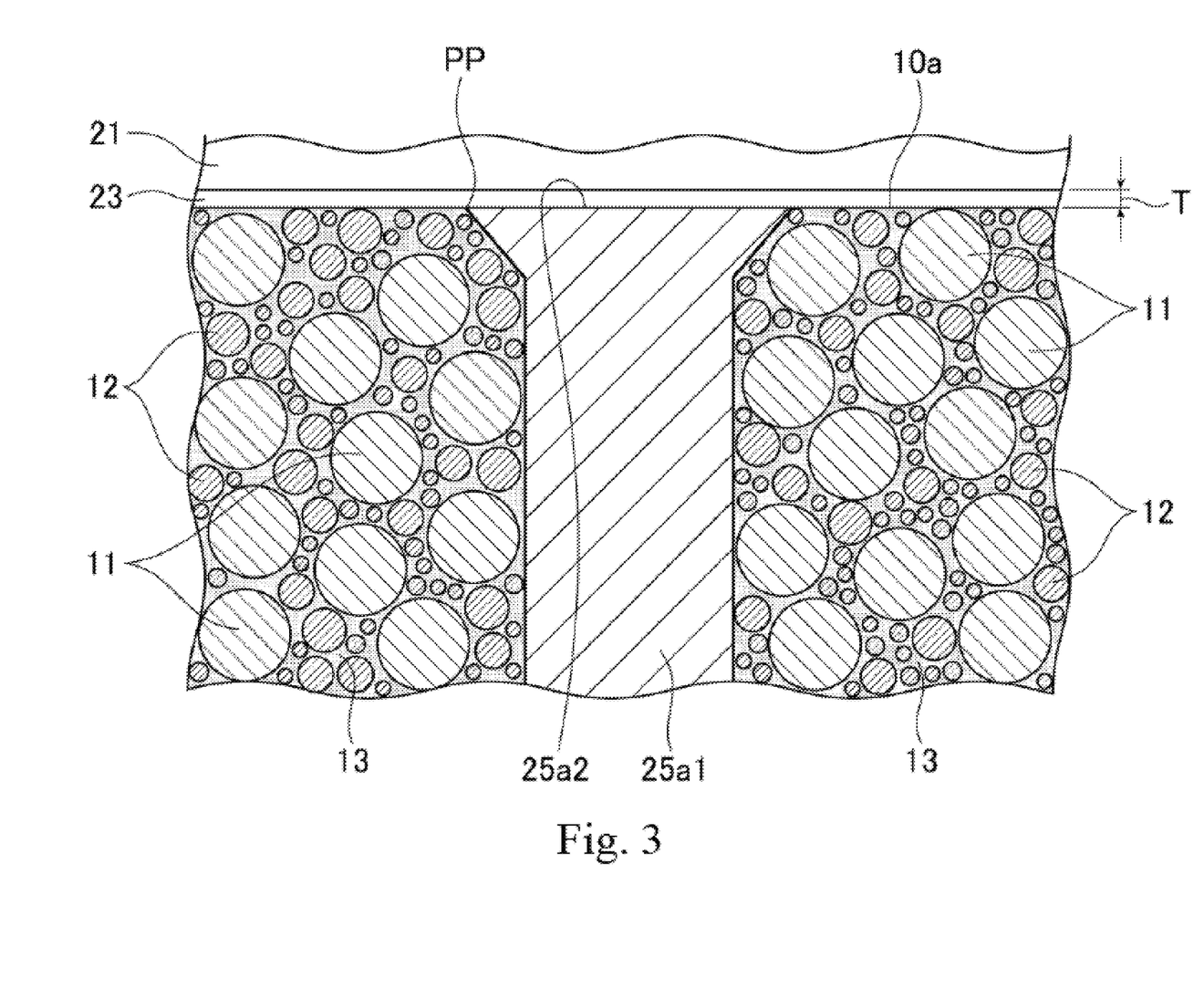
FIG. 3 is an enlarged sectional view showing, on an enlarged scale, a sectional surface around the joint between one end portion of a conductor and an external electrode in the coil component shown in FIG. 1.

FIG. 3 is an enlarged sectional view showing, on an enlarged scale, a sectional surface around the joint between one end portion of the conductor 25 and the external electrode 21 in the coil component 1 shown in FIG. 1. As shown in FIG. 3, the coil component 1 includes a first film 23 interposed between the external electrode 21 and one end portion of the conductor 25 (the lead-out conductor 25a1). In other words, the external electrode 21 and one end portion of the conductor 25 are electrically connected to each other via the first film 23. The coil component 1 further includes a second film (not shown) interposed between the external electrode 22 and the other end portion of the conductor 25 (the lead-out conductor 25b1). In the embodiment shown, the first film 23 and the second film have the same functionality and shape, and these films are formed of the same material. The following description on the first film 23 also applies to the second film unless in specific cases. In addition, FIGS. 3 and 4 for description of the first film 23 also apply to the second film.

The first film 23 is interposed between the end portion of the conductor 25 (the lead-out conductor 25a1) and the external electrode 21, and thus the end portion of the conductor 25 and the external electrode 21 are electrically connected to each other via the first film 23. The first film 23 electrically connects between the end portion of the conductor 25 and the external electrode 21, but it does not necessarily physically contact with the end portion of the conductor 25 and the external electrode 21. In addition to the first film 23, another layer or film formed of a material having a high conductivity may be present between the end portion of the conductor 25 and the external electrode 21. The first film 23 is formed of a material having a much lower diffusion velocity than the material forming the external electrode 21. In the embodiment shown, the first film 23 is an oxide film. Specifically, the first film 23 is an oxide film of a metal material having the same or a lower ionization tendency than the material forming the conductor 25. That is, the first film 23 is a metal oxide film. By way of an example, supposing that the conductor 25 is formed of copper, the material forming the first film 23 may be a copper oxide such as $CuO$ or $Cu_2O$. The material forming the first film 23 is not limited to oxides of metal materials but may be, for example, oxides of Si, oxides of valve metals such as Fe, Ag, Sn, Cr, Zn, Al, Ti, Ta, Nb, Zr, Hf, Ru, In, Ga, and Ge, or oxides of alloys including these valve metals. The first metal 23 is not limited to the oxide film but may also be a nitride film, a carbonized film, or an oxynitride film. Examples of the nitride film include TiN, TaN, FeN, SiN, AlN, and so forth. Examples of the carbonized film include SiC, FeC, WC, diamond-like carbon, diamond, and so forth. Examples of the oxynitride film include TaON. The first film 23 and the second film are not necessarily formed of a single material but may be formed of a plurality of materials. In general, the diffusion velocities of the oxide, the nitride film, the carbonized film, and the oxynitride film of the above metal materials forming the first film 23 are an order of magnitude lower than that of the metal material contained in the external electrode 21. This significantly inhibits the migration of the impurity atoms.

At least a part of the first film 23 and at least a part of one end portion of the conductor 25 (the end surface 25a2 of the lead-out conductor 25a1) are connected with each other by metallic bond. The phrase "at least a part of one end portion of the conductor 25" mentioned here refers to some region of the end surface 25a2. For example, the first film 23 and the end portion 25a1 may be connected with each other by ionic bond at a peripheral portion PP of the end surface 25a2 (see FIG. 3). FIG. 3 shows an example in which the first film 23 and the end portion 25a1 of the conductor 25 are connected with each other by ionic bond at the entirety of the end surface 25a2. In the example shown in FIG. 3, the region of the end surface 25a2 at which the first film 23 and the end portion 25a1 are ion-bonded to each other includes the peripheral portion PP.

Figure 4:
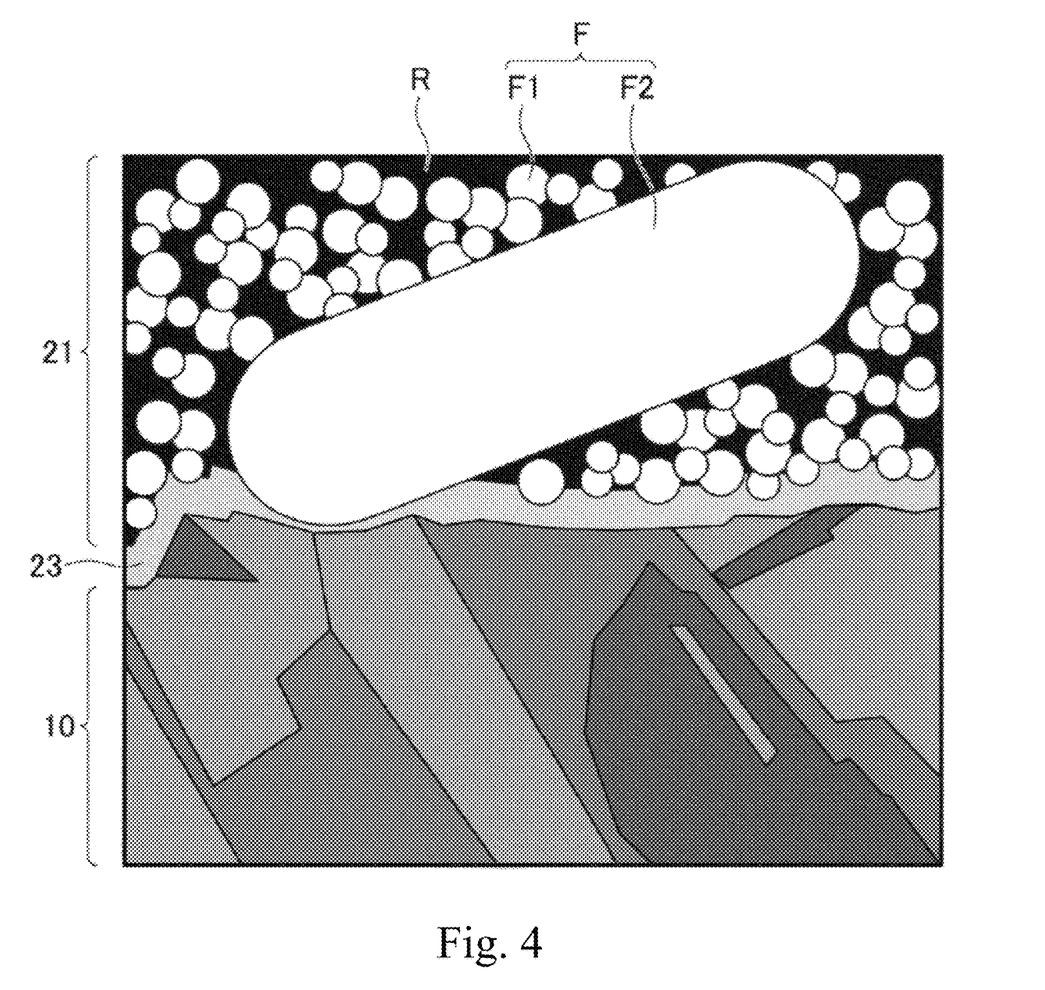
FIG. 4 is a schematic view showing a cross-sectional SEM image of the joint between an end surface of the conductor and a film in the coil component shown in FIG. 1.

As shown in FIG. 4, a plurality of indentations are formed in the interface between the first film 23 and the external electrode 21, and the indentations in the interface between the first film 23 and the external electrode 21 are larger than the indentations in the surface of the external electrode 21. The indentations in the interface between the first film 23 and the external electrode 21 are formed by, for example, oxidation reaction at the surface of the first film 23.

The thickness T of the first film 23 is 10 nm to 200 nm. The thickness T of the first film 23 herein refers to the dimension of the first film 23 in the direction perpendicular to the boundary surface between the first film 23 and the end portion 25a1 of the conductor 25. When the thickness T of the first film 23 is 200 nm or smaller, a Schottky current can pass through the first film 23, making it possible to maintain the electrical connection between the external electrode 21 and one end portion of the conductor 25. The thickness T of the first film 23 is preferably 50 nm or smaller. When the thickness T of the first film 23 is 50 nm or smaller, a tunnel current can pass through the first film 23, making it possible to further reduce the electrical resistance between the external electrode 21 and one end portion of the conductor 25.

Next, a description is given of a manufacturing method of the coil component 1 as an electronic component. First, the conductor 25 formed of a metal material or the like and having a coil shape is placed into a mold, along with a mixed resin composition prepared by mixing and kneading particles including the first metal magnetic particles 11 and the second metal magnetic particles 12 with the binder 13 composed of a resin or the like. This is then compression molded such that the end surface 25a2 of the lead-out conductor 25a1 and the end surface 25b2 of the lead-out conductor 25b1 of the conductor 25 are exposed through the surface. The coil shape of the conductor 25 is not particularly limited. For example, the conductor 25 is made of a wire wound in a spiral shape, or it may be made of a planar coil instead of the wound wire. The conductor 25 may have an insulating coat. The resin in the molded product is cured to obtain the magnetic base body 10 having the conductor 25 embedded therein. The coil component may be a winding coil. In this case, for example, the base body 10 is formed by placing into a mold a mixed resin composition prepared by mixing and kneading particles including the first metal magnetic particles 11 and the second metal magnetic particles 12 with the binder 13 composed of a resin or the like, and the conductor 25 is wound around the base body 10 such that the end surface thereof is positioned on the surface of the base body 10.

Next, the surface of the magnetic base body 10 through which the end surface 25a2 of the lead-out conductor 25a1 and the end surface 25b2 of the lead-out conductor 25b1 of the conductor 25 are exposed is smoothed, and a native oxide film is removed (the first step). For example, the surface of the magnetic base body 10 is smoothed by polishing using an abrasive. The particle size of the abrasive should preferably be smaller than that of the first metal magnetic particles 11. For example, when the average particle size of the first metal magnetic particles 11 is 30 μm, an abrasive having a particle size of 25 μm is selected. The native oxide film is removed by, for example, plasma etching using argon gas or sputtering. Any method of removing the native oxide film is available as long as it can remove oxides from the surface of the magnetic base body 10.

The next step is to form the first film 23, contacting with one end portion of the conductor 25, and the second film, contacting with the other end portion of the conductor 25 (the second step). In the second step, the first film 23 and the second film are formed of a material having a lower diffusion velocity than the material forming the external electrodes 21, 22. In the following description of the manufacturing method, it is supposed that the first film 23 and the second film are metal oxide films.

To form metal oxide films having a thickness T of about 10 nm to 50 nm as the first film 23 and the second film, heat treatment is performed for 10 to 60 minutes under the condition of a temperature of 120 to 200° C. in the atmosphere. Another way to form the metal oxide films having the thickness T of about 10 nm to 50 nm is to immerse the exposed end surface 25a2 and end surface 25b2 of the conductor 25 into pure water managed at pH 7 to 13, and then dry the end surfaces in the atmosphere. Still another way to form the metal oxide films having the thickness T of about 10 nm to 50 nm is to expose the end surface 25a2 and end surface 25b2 of the conductor 25 to an atmosphere at 80% or higher RH for 10 to 30 minutes, and then dry the end surfaces. To form metal oxide films having a thickness T of about 50 nm to 100 nm as the first film 23 and the second film, the exposed end surface 25a2 and end surface 25b2 of the conductor 25 are immersed in an aqueous solution managed to be alkaline at pH above 13 and then dried in the atmosphere. The first film 23 and the second film may also be formed by sputter deposition, ion beam deposition, and vapor deposition such as CVD (chemical vapor deposition).

The first film 23 and the second film may also be formed by applying, to the exposed end surface 25a2 and end surface 25b2 of the conductor 25, a resin containing a compound that serves to form a passive oxide film. Examples of such a compound include carboxylic acids, sulfonic acids, acid anhydrides, alcohols, amines, imidazoles, phosphoniums, silanes, and so forth. By way of an example, the first film 23 and the second film may be formed by applying a conductive resin paste containing any one of a metal filler and the above compound to the exposed end surface 25a2 and end surface 25b2 of the conductor 25, and performing heat treatment at 100 to 200° C. for a plurality of times.

The final step is to form the external electrode 21 contacting with the first film 23 and the external electrode 22 contacting with the second film (the third step). The coil component 1 is manufactured through the steps described above. The coil component 1 manufactured is mounted on the circuit board by soldering the external electrodes 21, 22 to the corresponding land portions of the circuit board.

As described above, the coil component 1 includes the first film 23 and the second film. The first film is positioned between one end portion (the lead-out conductor 25a1) of the conductor 25 and the external electrode 21, and the second film is positioned between the other end portion (the lead-out conductor 25b1) of the conductor 25 and the external electrode 22. The diffusion velocity in the first film 23 and the second film is lower than that in the external electrode 21 and the external electrode 22.

In general, coil components experience thermal expansion and thermal contraction due to Joule heat produced by electric current flowing through the coil components and the ambient temperature around the coil components being used. The thermal expansion and the thermal contraction cause strain to accumulate in the coil components, possibly resulting in a fault in the coil components. The coil components are particularly required to have stable bonding between the conductor and the external electrodes. Therefore, for conventional coil components, it is supposed that oxides remaining between the end portions of the conductor and the external electrodes should preferably be removed. By contrast, the present invention addresses the reduction in the joint strength between the conductor 25 and the external electrodes 21, 22 caused by alloying of the impurity atoms with the material forming the conductor 25. The coil component 1 positively includes the first film 23 and the second film having a lower diffusion velocity than the external electrode 21 and the external electrode 22. In this way, the presence of the first film 23 and the second film having a lower diffusion velocity than the external electrode 21 and the external electrode 22 inhibits movement of the impurity atoms. Accordingly, the migration of impurity atoms between the conductor 25 and the external electrode 21 and between the conductor 25 and the external electrode 22 can be inhibited. As a result, it is possible to inhibit the reduction in the joint strength between the conductor 25 and the external electrodes 21, 22 caused by alloying of the impurity atoms with the material forming the conductor 25.

In the coil component 1 according to one embodiment of the present invention, the thickness T of the first film 23 and the thickness of the second film are 10 nm to 200 nm. These thicknesses allow a Schottky current or a tunnel current to flow through the first film 23 and the second film. Thus, there is less impact of the first film 23 on electric connection between the conductor 25 and the external electrode 21 (an example of such an impact is an increased resistance between the conductor 25 and the external electrode 21 produced by the first film 23). Similarly, there is less impact of the second film on electric connection between the conductor 25 and the external electrode 22. Accordingly, it is possible to inhibit the migration of the impurity atoms while maintaining the electric connection between the conductor 25 and the external electrodes 21, 22.

In the coil component 1 according to one embodiment of the present invention, the first film 23 and the second film are an oxide of a metal material having the same or a lower ionization tendency than the material forming the conductor 25. In this configuration, the first film 23 and the second film can further inhibit the migration of the impurity atoms.

In the coil component 1 according to one embodiment of the present invention, indentations in the interface between the first film 23 and the external electrode 21 and the interface between the second film and the external electrode 22 are larger than the indentations in the surfaces of the external electrode 21 and the external electrode 22. In this configuration, the adhesion between the first film 23 and the external electrode 21 and the adhesion between the second film and the external electrode 22 can be increased by the anchor effect.

The method of manufacturing the coil component 1 according to one embodiment of the present invention includes the second step of forming the first film 23 and the second film such that the first film 23 is electrically connected with one end portion (the lead-out conductor 25a1) of the conductor 25 and the second film is electrically connected with the other end portion (the lead-out conductor 25b1) of the conductor 25. In the second step, a material having a lower diffusion velocity than the material forming the external electrode 21 and the external electrode 22 are used to form the first film 23 and the second film. In this way, since the first film 23 and the second film are formed of a material having a lower diffusion velocity than the material forming the external electrode 21 and the external electrode 22, movement of the impurity atoms is inhibited by the first film 23 and the second film. Accordingly, the migration of impurity atoms between the conductor 25 and the external electrode 21 and between the conductor 25 and the external electrode 22 can be inhibited.

Figure 5:
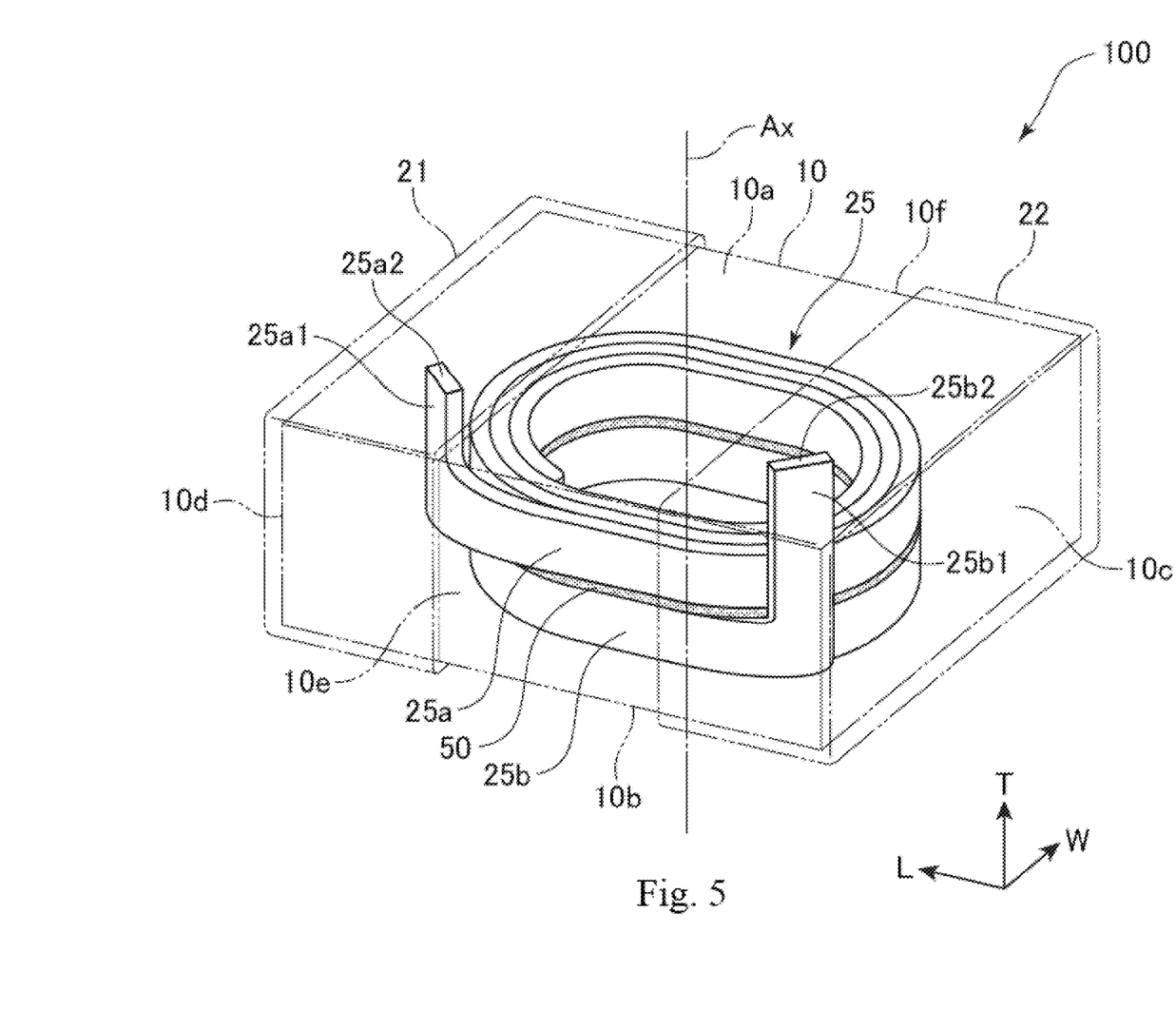
FIG. 5 is a perspective view schematically showing a coil component according to another embodiment of the present invention.

Next, a description is given of a coil component 100 according to another embodiment of the present invention with reference to FIG. 5. FIG. 8 is a perspective view schematically showing the coil component 100. As shown, similarly to the coil component 1, the coil component 100 includes a coil conductor 25 provided in the base body 10, an external electrode 21 disposed on a surface of the base body 10, and an external electrode 22 disposed on the surface of the base body 10 at a position spaced apart from the external electrode 21. The coil component 100 is different from the coil component 1 in that it includes an insulating plate 50 and two conductors 25. The insulating plate 50 is provided in the base body 10, and the two conductors 25 are provided on the top-side surface and the bottom-side surface of the insulating plate 50, respectively.

Similarly to the coil component 1, the coil component 100 includes the first film 23 and the second film. The first film is positioned between one end portion (the lead-out conductor 25a1) of the conductor 25 and the external electrode 21, and the second film is positioned between the other end portion (the lead-out conductor 25b1) of the conductor 25 and the external electrode 22. The diffusion velocity in the first film 23 and the second film is lower than that in the external electrode 21 and the external electrode 22. Accordingly, for the same reason as with the coil component 1, the migration of impurity atoms between the conductor 25 and the external electrode 21 and between the conductor 25 and the external electrode 22 can be inhibited.

The dimensions, materials, and arrangements of the constituent elements described for the above various embodiments are not limited to those explicitly described for the embodiments, and these constituent elements can be modified to have any dimensions, materials, and arrangements within the scope of the present invention. Furthermore, constituent elements not explicitly described herein can also be added to the above-described embodiments, and it is also possible to omit some of the constituent elements described for the embodiments.

Figure 6:
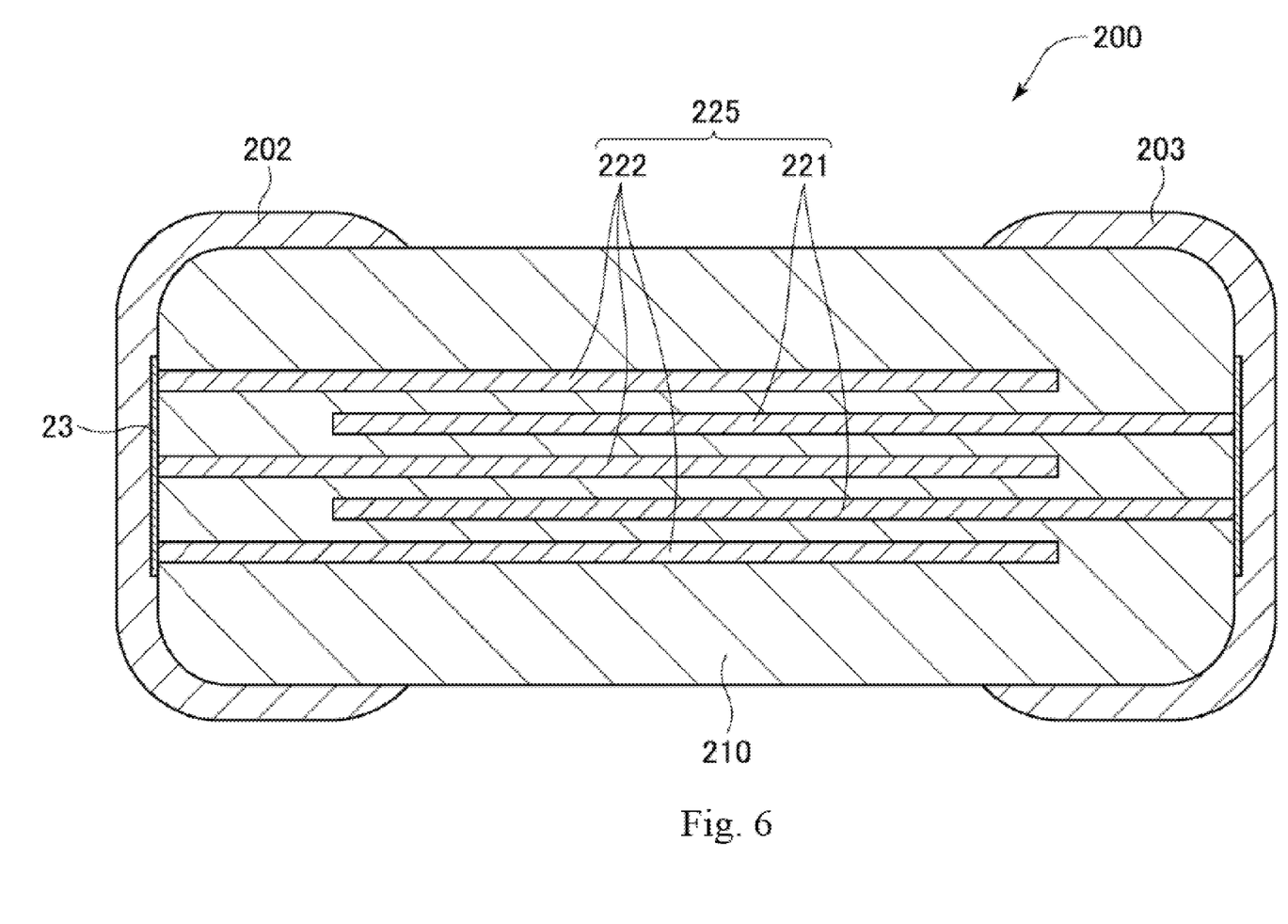
FIG. 6 is a sectional view schematically showing a capacitor as an electronic component according to still another embodiment of the present invention.

The electronic component according to the present invention is not limited to a coil component but may be a capacitor, for example. FIG. 6 is a sectional view schematically showing a capacitor 200 as an electronic component according to still another embodiment of the present invention. As shown in FIG. 6, the capacitor 200 includes a base body 210, a conductor 225 provided in the base body 210, and external electrodes 202, 203 disposed on the periphery of the base body 210. In the embodiment shown in FIG. 6, the capacitor 200 is what is called a MLCC (multilayer ceramic capacitor), and the conductor 225 includes a plurality of first electrode layers 221 and a plurality of second electrode layers 222. The first electrode layers 221 and the second electrode layers 222 alternate, and the base material 210 mediates between these layers. The portions of the base material 210 mediating between the first electrode layers 221 and the second electrode layers 222 serve as a dielectric. Similarly to the coil component 1, the capacitor 200 includes the first film 23 and the second film. The first film 23 is positioned between the external electrode 202 and the conductor 225, and the second film is positioned between the external electrode 203 and the conductor 225.

Similarly to the coil component 1, the capacitor 200 includes the first film 23 and the second film. The first film is electrically connected with the external electrode 202 and positioned between one end portion of the conductor 225 and the external electrode 202, and the second film is electrically connected with the external electrode 203 and positioned between the other end portion of the conductor 225 and the external electrode 203. The diffusion velocity in the first film 23 and the second film is lower than that in the external electrode 202 and the external electrode 203. Accordingly, for the same reason as with the coil component 1, the migration of impurity atoms between the conductor 225 and the external electrode 202 and between the conductor 225 and the external electrode 203 can be inhibited.

What is claimed is:

1. An electronic component, comprising:
   a base body;
   a conductor provided inside or outside the base body;
   a first external electrode and a second external electrode both electrically connected to the conductor; and
   a first film positioned between the first external electrode and one end portion of the conductor electrically connected to the first external electrode, and
   a second film positioned between the second external electrode and the other end portion of the conductor electrically connected to the second external electrode,
   wherein a diffusion velocity in the first film and the second film is lower than that in the first external electrode and the second external electrode, and
   wherein the first film and the second film are nitride films, carbonized films, or oxynitride films, and
   wherein the nitride films include TaN, FeN, SiN or AlN, and the oxynitride films include TaON.

2. The electronic component of claim 1, wherein a thickness of the first film and a thickness of the second film are 10 nm to 200 nm.

3. The electronic component of claim 1, wherein the first film and the second film are amorphous.

4. The electronic component of claim 1, wherein indentations in an interface between the first film and the first external electrode and an interface between the second film and the second external electrode are larger than indentations in surfaces of the first external electrode and the second external electrode.

5. The electronic component of claim 1, wherein the conductor includes a portion wound around a coil axis.

6. A circuit board comprising the electronic component of claim 1.

7. An electronic device comprising the circuit board of claim 6.

8. A method of manufacturing an electronic component including a base body, a conductor provided inside or outside the base body, and a first external electrode and a second external electrode both electrically connected to the conductor, the method comprising:
   a first step of positioning a first end portion and a second end portion of the conductor at a surface of the base body, the first end portion being configured to be electrically connected with the first external electrode, the second end portion being configured to be electrically connected with the second external electrode;
   a second step of forming a first film and a second film, the first film being electrically connected with the first end portion, the second film being electrically connected with the second end portion; and
   a third step of forming a first external electrode and a second external electrode, the first external electrode being electrically connected with the first film, the second external electrode being electrically connected with the second film,
   wherein in the second step, the first film and the second film are formed of a material having a lower diffusion velocity than a material forming the first external electrode and the second external electrode, the first film and the second film being nitride films, carbonized films, or oxynitride films, the nitride films including TaN, FeN, SiN or AlN, the oxynitride films including TaON.

* * * * *